United States Patent Office 3,291,758

Patented Dec. 13, 1966

3,291,758

SUPERCONDUCTIVE MATERIALS

Harry N. Treaftis, Liverpool, N.Y., assignor to General Electric Company, a corporation of New York No Drawing. Filed May 31, 1963, Ser. No. 284,333
4 Claims. (Cl. 252—512)

This invention relates to superconductive materials which are useful in connection with superconductive devices and circuit elements and as superconductive structures in and of themselves.

The use of superconductive circuits and devices using such circuits which exhibit at low temperatures approaching 0° K. no electrical resistance is well known. Among such devices and equipment in which they are used are cryotrons, computers, IR sensors, cryogenic gyroscopes, magnetic shielding films, and the like. Superconductive materials are often used in highly miniaturized form employing fine wires or very thin films which are very delicate and subject to destruction by the application of physical force or heat. These characteristics produce a definite problem when the elements of such devices are to be joined or connected one to the other. While solders are a logical means for joining superconductive elements, the use of ordinary heat-melted solders generally destroys or damages the superconductive elements themselves. It is also well known to machine certain superconductive materials such as niobium, tin and other superconducting metals and alloys of such metals to provide structural parts for devices such as cryogenic gyroscopes, and the like, which operate at temperatures approaching 0° K. Inasmuch as such structural parts are often very small and very complicated as to form or shape, making such superconductive structures and parts is very costly. From the above it will be quite evident that there is a need for easy and convenient means of joining superconductive elements, of forming thin films of superconducting materials and for making superconductive elements of complicated shape. It is therefore a principal object of this invention to provide superconductive materials which will fill the above need. A specific object of this invention is to provide an improved and convenient means for joining together superconductive elements. Another object is to provide new superconductive materials which are convenient to use. A still further object of the invention is to provide a superconductive material which may be readily formed or molded into complicated shapes without machining or with a minimum of machining or final shaping.

Briefly, the invention relates to superconductive elements comprising a liquid epoxy resin having 1,2 epoxy groups, a room temperature curing agent for said epoxy resin and a finely divided powder of superconductive metal material.

Those features of the invention which are believed to be novel are set forth in the claims appended hereto. The invention will, however, be better understood and further advantages and uses appreciated from a consideration of the following description.

The liquid epoxy resins useful in connection with the invention comprise a polyether derivative of a polyhydric organic compound, said derivatives containing 1,2 epoxy groups, said compound being selected from the class consisting of polyhydric alcohols and phenols containing at least two phenolic hydroxy groups. They are described in Castan United States Patents Nos. 2,324,483 and 2,444,333, British Patent No. 518,057 and British Patent No. 579,698. Generally, the ethoxyline resins described therein are the reaction product of an epihalogenohydrin such as epichlorohydrin and a phenol having at least two phenolic hydroxy groups such as bis-(4-hydroxy phenyl)-2,2-propane. United States Patents Nos. 2,494,295; 2,500,600 and 2,511,913 describe further ethoxyline resins which can be used in conjunction with my invention. The above patents are hereby incorporated by reference in this application. The ethoxyline resins used herein have more than one epoxy group per molecule. They can be prepared by reacting a polyhydroxy alcohol or phenol such as hydroquinone, resorcinol, glycerine and condensation products of phenols with ketones, for example, bis-(4-hydroxy phenyl)-2,2-propane with epichlorohydrin. The reaction of epichlorohydrin with bis-(4-hydroxy phenyl)-2,2-propane is as follows:

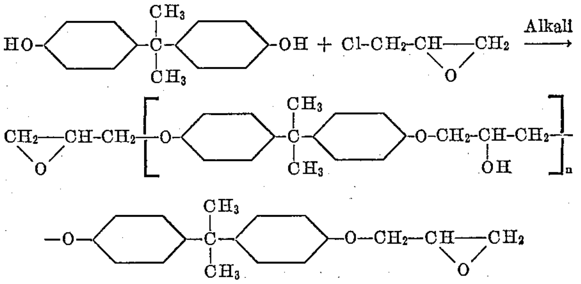

where $n$ has an average value ranging from 0 to about 7. Such ethoxyline resins are sold under the name of Epon by Shell Chemical Corporation, under the name Araldite by the Ciba Company, as Epi-Rez resins by Devoe-Raynolds Company and ERL resins by the Bakelite Company. The data given below for such resins is representative.

| Epoxy resin: | Epoxide equivalent |
|---|---|
| Erl 2774 | 185–200 |
| ERL 3794 | 170–182 |
| Araldite 6005 | 190 |
| Araldite 6010 | 195 |
| Araldite 6020 | 210 |
| Epi-Rez 510 | 180–200 |
| Epon 562 | 140–165 |
| Epon 820 | 175–210 |
| Epon 828 | 175–210 |

It is necessary in connection with the present invention that the liquid epoxy resin cure at room temperature and that the exotherm of the curing process, if any, not raise the temperature above about 50° C. in order that the superconductive element, if delicate, fine or thin, be not destroyed by the heat of the curing process. Thus, the preferred curing agents for the present materials are the liquid so-called room temperature curing amine catalysts or curing agents, such as ethylenediamine, diethylenetriamine, triethylenetetramine, diethylaminopropylamine, trisdimethylaminomethyl phenol and many others which are well known to those skilled in the art and which are liquid in nature in order to facilitate the preparation of the material.

Any well known superconductive materials which are capable of being prepared in a divided state having a size of at least 320 mesh or smaller are useful in connection with the present invention. Such superconductive materials include lead, niobium, vanadium, indium, tin, alloys employing indium and tin, alloys of silver and lead, silver and tin, silver and zinc, arsenic and lead, arsenic and tin, gold and lead, gold and tin, barium and bismuth, barium and rhodium, bismuth and indium, bismuth and caesium, bismuth and nickel, bismuth and lead, bismuth and lead and tin, bismuth and lead and antimony, bismuth and tin, bismuth and strontium, bismuth and thallium, calcium and iridium, calcium and lead, cadmium and lead, cobalt and zirconium, and many other alloys. It should be kept in mind that when materials which are readily oxidized in a fine granular form are used, such as niobium, precautions should be taken to protect such finely divided material from oxidation until it is incorporated in the oxygen-excluding composition.

In carrying out the invention, about 10.0 parts by weight of the liquid epoxy resin are used in conjunction with from about 1.0 to 1.5 parts by weight of the liquid room temperature curing agent for the epoxy resin, there being used from about 88 to 90 parts by weight of the finely divided superconductive material. It has been found that when less than about 88 parts, for example, about 85 parts by weight of finely divided superconductive material, is used in connection with the present invention, there is a lack of good contact between the superconductive particles in the final material which destroys the otherwise superconductive nature of the material. On the other hand, the use of more than about 90 parts by weight of the superconductive powder results in a mixture which is generally too viscous to be readily handled or thoroughly mixed. In preparing the present materials the fine mesh powder is simply mixed in the liquid epoxy resin-curing agent combination or, alternatively, the powder may be mixed with the liquid epoxy resin and the room temperature curing agent later added with thorough mixing just before the material is to be used. It has been found that the epoxy resins which are used in the present invention are characterized by such contraction at temperatures approaching 0° K. that the prescribed amounts of superconductive material used as a filling maintain excellent contact throughout the mass to provide as a whole a superconductive material.

The following example is exemplary of the present invention and is not to be taken as limiting in any way; on the other hand, it is merely illustrative of the materials which may be used in conjunction therewith.

There was added to 10.0 parts by weight of Epon 820 resin, 1.0 part by weight diethylenetriamine as a curing agent. There was added to the epoxy resin-curing agent combination with thorough mixing 90 parts by weight of a 50% indium-50% tin alloy powder having a mesh size of 350. This material was spread in films which cured in a matter of about 120 minutes at room temperature. It was also used to mold parts having an over-all size of about 1/16" x 1/8" x 3" which cured in about 60 minutes without such excessive heating which would destroy the superconductive nature of the filler powder. The material was used as a room temperature curing solder to effectively join fine wires of superconductive materials. It was also spread in a film which rapidly cured at room temperature and which film in itself is useful as a superconductive material or element at 4.2° K. or as a magnetic shielding material.

There are provided, then, by the present invention superconductive materials which are very versatile in nature. They can be used as solders or connecting media to connect fine, easily destroyed superconductive elements and they can be used as superconductive films. They can also be used to mold superconductive structures which are complicated in shape.

What I claim as new and desire to secure by Letters Patent of the United States is:

1. A superconductive connecting material for superconductive elements, said material consisting essentially of, by weight, 10.0 parts of a liquid complex epoxy resin containing more than one 1,2 epoxide groups per molecule, from about 1.0 to 1.5 parts of a liquid room temperature amino curing agent for said epoxy resin and from about 88 to 90 parts of finely divided nonoxidized superconductive metal.

2. A superconductive material consisting essentially of, by weight, 10.0 parts of a liquid complex epoxy resin containing more than one 1,2 epoxide groups per molecule, from about 1.0 to 1.5 parts of a liquid room temperature amino curing agent for said epoxy resin and from about 88 to 90 parts of finely divided nonoxidized superconductive metal.

3. A superconductive material consisting essentially of, by weight, 10.0 parts of a liquid complex epoxy resin containing more than one 1,2 epoxide groups per molecule, one part diethylene triamine and 90 parts of a nonoxidized 50% indium-50% tin alloy having a mesh size of at least about 320.

4. A superconductive material consisting essentially of, by weight, 10.0 parts of a liquid epoxy resin containing more than one 1,2 epoxide groups per molecule, from about 1.0 to 1.5 parts of a liquid room temperature amino curing agent for said epoxy resin and from about 88 to 90 parts of a finely divided nonoxidized superconductive metal.

References Cited by the Examiner

UNITED STATES PATENTS

| | | | |
|---|---|---|---|
| 2,774,747 | 12/1956 | Wolfson et al. | 252—514 X |
| 2,944,036 | 7/1960 | Floyd et al. | 260—37 |

OTHER REFERENCES

Frost: Advances in Cryogenic Engineering, volume 5, Plenum Press (1960), pages 375–83.

Hansen: Constitution of Binary Alloys (1958), pages 861–2.

Skeist: Epoxy Resins, Reinhold (1962), page 34.

Peckner et al.: Materials in Design Engineering (July 1961), page 108 relied on.

LEON D. ROSDOL, *Primary Examiner.*

JULIUS GREENWALD, ALBERT T. MEYERS, *Examiners.*

J. D. WELSH, *Assistant Examiner.*